(12) United States Patent
Sato (10) Patent No.: US 8,703,035 B2
(45) Date of Patent: Apr. 22, 2014

(54) IMPRINT APPARATUS AND METHOD OF MANUFACTURING ARTICLE

(75) Inventor: Hiroshi Sato, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 105 days.

(21) Appl. No.: 13/101,614

(22) Filed: May 5, 2011

(65) Prior Publication Data

US 2011/0278768 A1   Nov. 17, 2011

(30) Foreign Application Priority Data

May 14, 2010  (JP) ................................. 2010-112664

(51) Int. Cl.
   *B28B 11/08*  (2006.01)

(52) U.S. Cl.
   USPC .......... 264/293; 264/40.1; 425/171; 425/150; 356/4.07; 356/4.09; 356/305

(58) Field of Classification Search
   USPC .......... 264/40.1, 293; 425/171, 150; 356/4.07, 356/4.09, 305
   See application file for complete search history.

(56) References Cited

U.S. PATENT DOCUMENTS

| | | | |
|---|---|---|---|
| 5,687,010 A | 11/1997 | Van Tilborg et al. | |
| 5,801,832 A | 9/1998 | Van Den Brink | |
| 6,909,998 B2 | 6/2005 | Hocheng et al. | |
| 6,976,424 B2 | 12/2005 | Bruno et al. | |
| 7,093,540 B2 | 8/2006 | Giancaterino et al. | |
| 7,197,176 B2 | 3/2007 | Fukui et al. | |
| 7,682,552 B2 | 3/2010 | Nien et al. | |
| 7,837,907 B2* | 11/2010 | Nimmakayala et al. | ........ 264/39 |
| 2007/0102838 A1 | 5/2007 | Simon | |
| 2009/0026657 A1 | 1/2009 | Nimmakayala et al. | |
| 2009/0108483 A1* | 4/2009 | Suehira et al. | ............... 264/40.5 |

FOREIGN PATENT DOCUMENTS

| | | |
|---|---|---|
| JP | 2008-509825 A | 4/2008 |
| KR | 2009-0009874 A | 1/2009 |
| KR | 2010-0050462 A | 5/2010 |
| TW | 313738 B | 8/1997 |
| TW | 562755 B | 11/2003 |
| TW | 571087 B | 1/2004 |

(Continued)

OTHER PUBLICATIONS

Korean Office Action for corresponding KR 10-2011-0042307, dated Jul. 26, 2013.

(Continued)

*Primary Examiner* — Joseph S Del Sole
*Assistant Examiner* — David N Brown, II
(74) *Attorney, Agent, or Firm* — Rossi, Kimms & McDowell LLP (57) ABSTRACT

An imprint apparatus includes a detector and an adjusting device. A second mark formed on a substrate includes a grating pattern having grating pitches in first and second directions which are respectively parallel to first and second axes which are parallel to a pattern surface of a mold and orthogonal to each other. A first mark formed on the mold includes a grating pattern having a grating pitch in the first direction. The first and second marks have different grating pitches in the first direction. The detector includes an image sensor, and an optical system which forms a moire fringe on an image sensing surface of the image sensor. The adjusting device adjusts, in a plane including the second axis and a third axis that is perpendicular to the first and second axes, an angle between the optical axis of the detector and the third axis.

14 Claims, 9 Drawing Sheets

(56) References Cited

FOREIGN PATENT DOCUMENTS

| TW | I235628 B | 7/2005 |
|---|---|---|
| TW | I252809 B | 4/2006 |
| WO | 2006/017793 A2 | 2/2006 |

OTHER PUBLICATIONS

Taiwanese Office Action for corresponding TW 100114880, dated Oct. 1, 2013.

* cited by examiner

IMPRINT APPARATUS AND METHOD OF MANUFACTURING ARTICLE

BACKGROUND OF THE INVENTION

1. Field of the Invention

The present invention relates to an imprint apparatus and a method of manufacturing an article.

2. Description of the Related Art

Imprint techniques are coming into practical use as one of the nanolithographic techniques intended for mass production of magnetic storage media and semiconductor devices. An imprint apparatus uses a mold on which a fine pattern is formed as an original, and presses the mold against a resin (imprint material) dispensed on a substrate such as a silicon wafer or a glass plate to transfer the pattern of the mold onto the substrate, thereby forming a fine pattern on the substrate. At this time, a detector which measures the relative position between a mark formed on the mold and that formed on the substrate is used to align the mold and the substrate. Especially a measurement device which uses moire fringes (moire signal) generated by these two marks is useful because it can achieve high measurement accuracy by means of a simple optical system. Japanese PCT National Publication No. 2008-509825 discloses such an imprint apparatus.

SUMMARY OF THE INVENTION

The mark formed on the substrate is rarely bared on the surface of the substrate. When the mark has a layered structure formed on it, detection light for detecting the position of the mark often weakens because, for example, of interference due to a thin film (the layered structure) and the detector cannot detect moire fringes. In view of this, the present invention provides, for example, an imprint apparatus advantageous in terms of detection of a moire fringe generated by marks respectively formed on a mold and a substrate.

According to one aspect of the present invention, there is provided an imprint apparatus which molds an imprint material on a substrate with a mold to form a pattern on the substrate, the apparatus comprising: a holder configured to hold a mold on which a first mark is formed; a stage configured to hold a substrate on which a second mark is formed; a detector; and an adjusting device configured to adjust an angle of an optical axis of the detector, wherein the second mark includes a grating pattern having grating pitches in both a first direction and a second direction which are respectively parallel to a first axis and a second axis which are parallel to a pattern surface of the mold and orthogonal to each other, the first mark includes a grating pattern having a grating pitch in the first direction, the first mark and the second mark have respective grating pitches different from each other in the first direction, and the detector includes an image sensor, and an optical system configured to form a moire fringe on an image sensing surface of the image sensor using a light which is obliquely incident on the first mark, transmitted through a grating of the first mark, diffracted by a grating of the second mark, and transmitted again through the grating of the first mark, wherein the adjusting device is configured to adjust, in a plane including the second axis and a third axis that is perpendicular to the first axis and the second axis, an angle between the optical axis of the detector and the third axis.

Further features of the present invention will become apparent from the following description of exemplary embodiments with reference to the attached drawings.

DESCRIPTION OF THE EMBODIMENTS

First Embodiment

Figure 1:
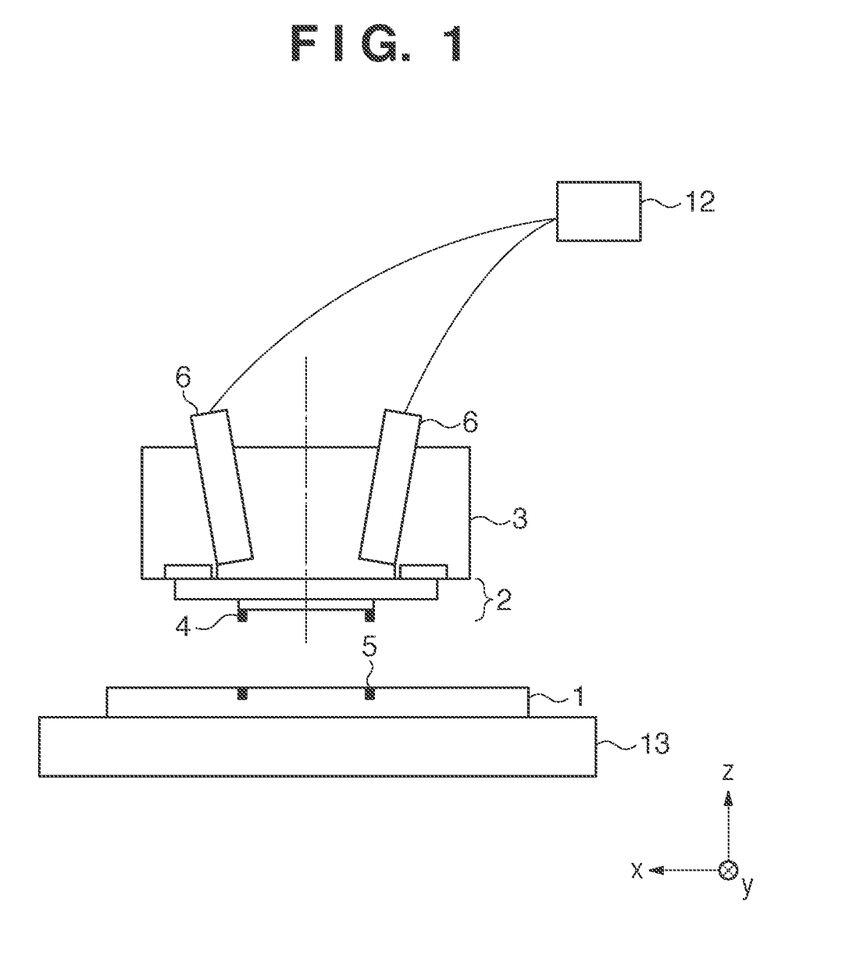
FIG. 1 is a view showing an imprint apparatus.
Figure 2:
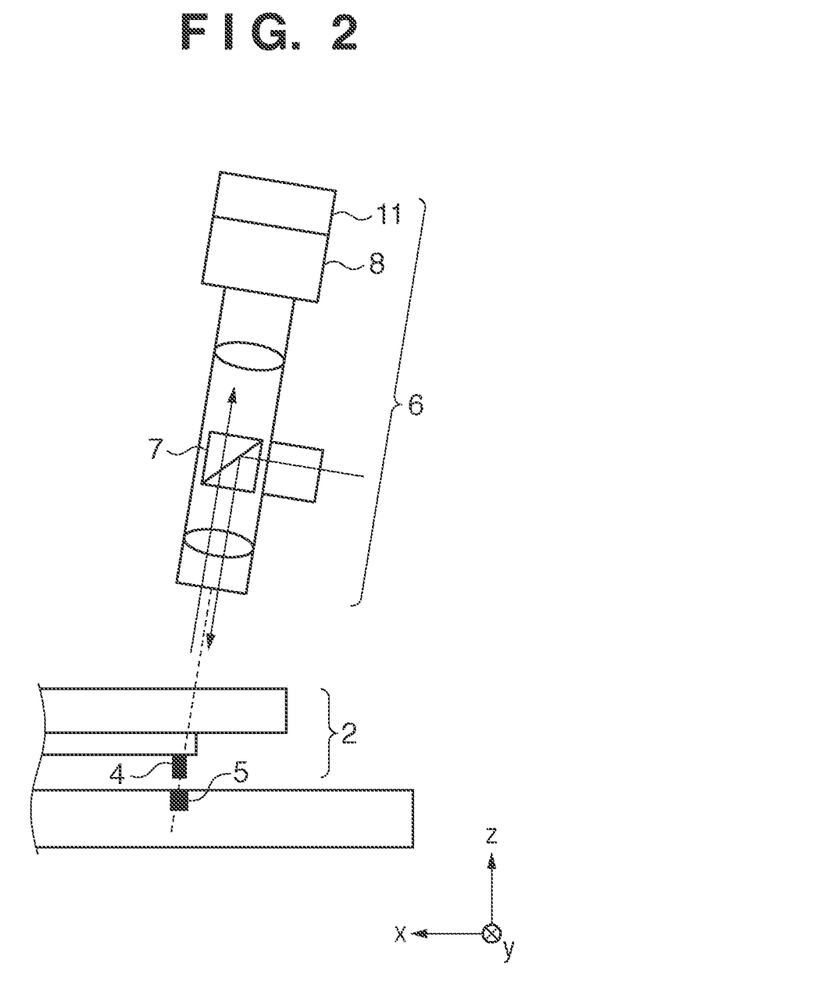
FIG. 2 is a view showing a detector according to the first embodiment.

An imprint apparatus including a built-in detector according to the first embodiment will be described with reference to FIG. 1. The imprint apparatus performs an imprint process of dispensing an uncured resin onto a substrate 1 held by a substrate stage 13, pressing the pattern surface of a mold 2 against the resin, and curing the resin. The mold 2 is held by a holder (imprint head) 3. Detectors (scopes) 6 are placed in the holder 3. The scope 6 optically observes a mark (first mark) 4 formed on the mold 2 and a mark (second mark) 5 formed on the substrate 1, thereby detecting their relative positional relationship. The scope 6 is slightly tilted in order to ensure an optical path necessary to illuminate the resin from above with light for curing the resin in an imprint process. An adjusting device 12 including a driving mechanism and its controller can adjust the angle of the optical axis of the scope 6. The scope 6 uses, for example, a half prism 7 to guide light emitted by a light source (not shown) to be obliquely incident on the marks 4 and 5 (FIG. 2). Light which is transmitted through the mark 4, diffracted by the mark 5, and transmitted again through the mark 4 forms moire fringes on the image sensing surface (image pickup surface) of an image sensor (image pickup device) 8. A processor 11 computes the relative positional relationship between the marks 4 and 5 in the y direction from a signal of the moire fringes (moire signal), and adjusts the relative position between the mold 2 and the substrate 1 in the y direction in accordance with the computation result obtained by the processor 11. Referring to FIG. 2, the y direction parallel to the y-axis is defined as the measurement direction, and the x direction parallel to the x-axis is defined as the non-measurement direction. The x- and y-axes are defined as first and second axes, respectively, which are orthogonal to each other and parallel to the pattern surface of the mold 2, and the x and y directions are defined as first and second directions, respectively.

Measurement which uses a moire signal will be described with reference to FIG. 3. Two types of marks 4 and 5 including grating patterns with different grating pitches, which are shown in 3A and 3B, respectively, are prepared. When the marks 4 and 5 are superposed on each other, a light and dark fringe pattern, as shown in 3C, is generated. This fringe pattern serves as a moire signal. The light and dark positions of the moire signal change depending on the relative positional relationship between the two marks 4 and 5. For example, when the mark 4 or 5 is slightly shifted from the other, the moire signal shown in 3C changes to that shown in 3D. Because the moire signal enhances the actual amount of positional shift between the two marks 4 and 5 to generate large light and dark fringes, the scope 6 can accurately measure the relative positional relationship between the two marks 4 and 5 even when it has a low resolution.

Figure 3:
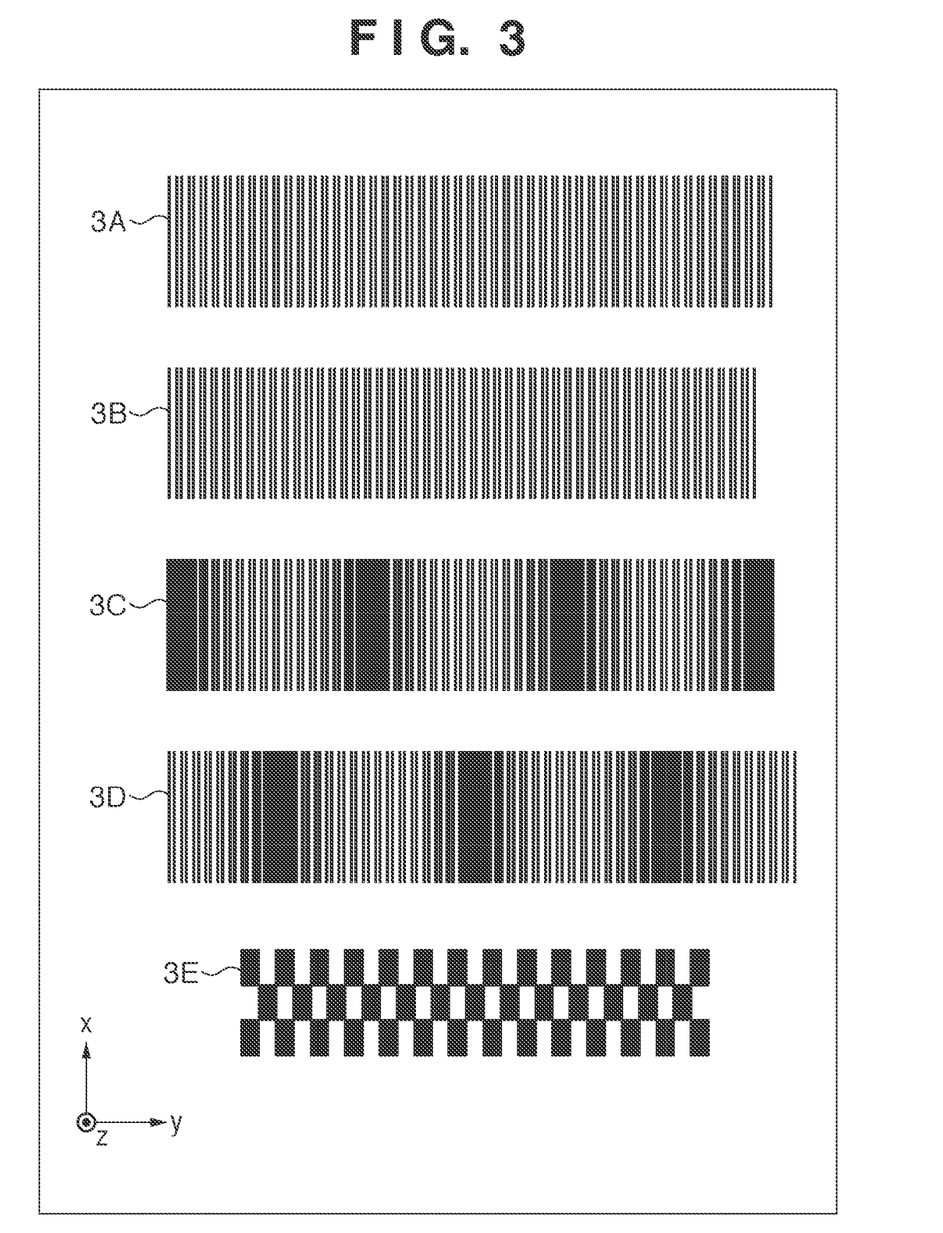
FIG. 3 shows views of a measurement method which uses a moire signal.

The optical axis of the scope 6 used in the imprint apparatus is slightly tilted, as described earlier, so illumination light does not return to the scope 6 when in both the marks 4 and 5 a grating extends in one direction, as shown in parts 3A and 3B of FIG. 3. In this case, a mark in which a grating extends in both the x and y directions, as shown in part 3E of FIG. 3, is used as the mark 5 on the substrate 1. Using a checkerboard mark shown in part 3E as the mark 5 on the substrate 1, a moire signal can be obtained even when the scope 6 is tilted with respect to the z-axis (third axis) within the x-z plane (within a plane perpendicular to the first axis).

Figure 4:
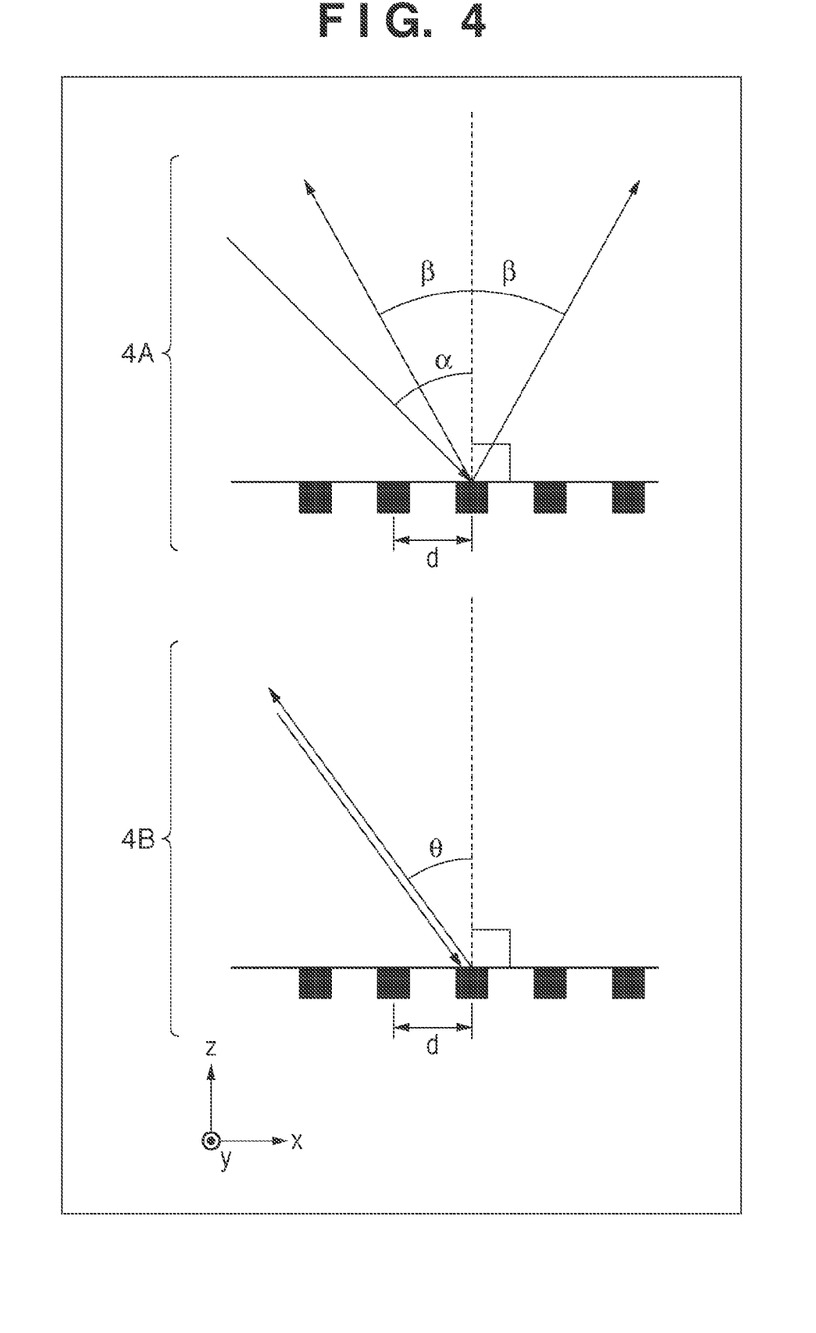
FIG. 4 shows views of the relationship between incident light and diffracted light.

The diffraction angle β is given by:

$$d(\sin \alpha \pm \sin \beta) = n\lambda \quad (1)$$

where d is the grating pitch of the mark 5 in the x direction, α is the incident angle on the mark 5, λ is the wavelength of light incident on the mark 5, and n is the order of diffraction (a natural number of 1, 2, 3 . . . ) (see part 4A in FIG. 4).

Note that the scope 6 in this embodiment includes an illumination system for providing light which is obliquely incident on the mark 4, and the optical axis of the illumination system and that (the optical axis of the detector) of an imaging optical system of the scope 6 coincide with each other. Thus, letting θ be the angle (tilt angle) of the optical axis of the scope 6 from the z-axis (third axis), θ=α=β, so the tilt angle θ of the scope 6 is given by:

$$\theta = \sin^{-1}(n\lambda/2d) \quad (2)$$

(see part 4B of FIG. 4)

Hence, the tilt angle θ of the scope 6 is determined by the grating pitch d of the mark 5 on the substrate 1 and the wavelength λ of oblique-incidence illumination light.

The capability of the scope 6 in preventing the adverse effect of thin-film interference by a layered structure formed on the substrate will be described next. The mark 5 on the substrate 1 is rarely exposed on the surface of the substrate 1, and is likely to be formed inside a layered structure including several to several ten layers. When a layer made of a transparent substance is present on the mark 5, illumination light may not return to the scope 6 from the mark 5 due to thin-film interference, depending on the wavelength of the illumination light. At this time, changing the wavelength of the illumination light cancels the conditions under which thin-film interference occurs, thus making it possible to observe the mark 5. Based on this fact, the wavelength λ of illumination light is set variable when the mark 5 is observed by the scope 6 as well to set the conditions under which optimum detection is possible, in accordance with the layered structure. At the same time, based on the condition presented in equation (2), the tilt angle θ of the scope 6 is set variable to drive the scope 6 by the driving mechanism in the adjusting device 12 so as to obtain a diffraction angle derived from the wavelength λ of illumination light and the grating pitch d of the mark 5 in the x direction, thereby obtaining a measurement signal.

Figure 5:
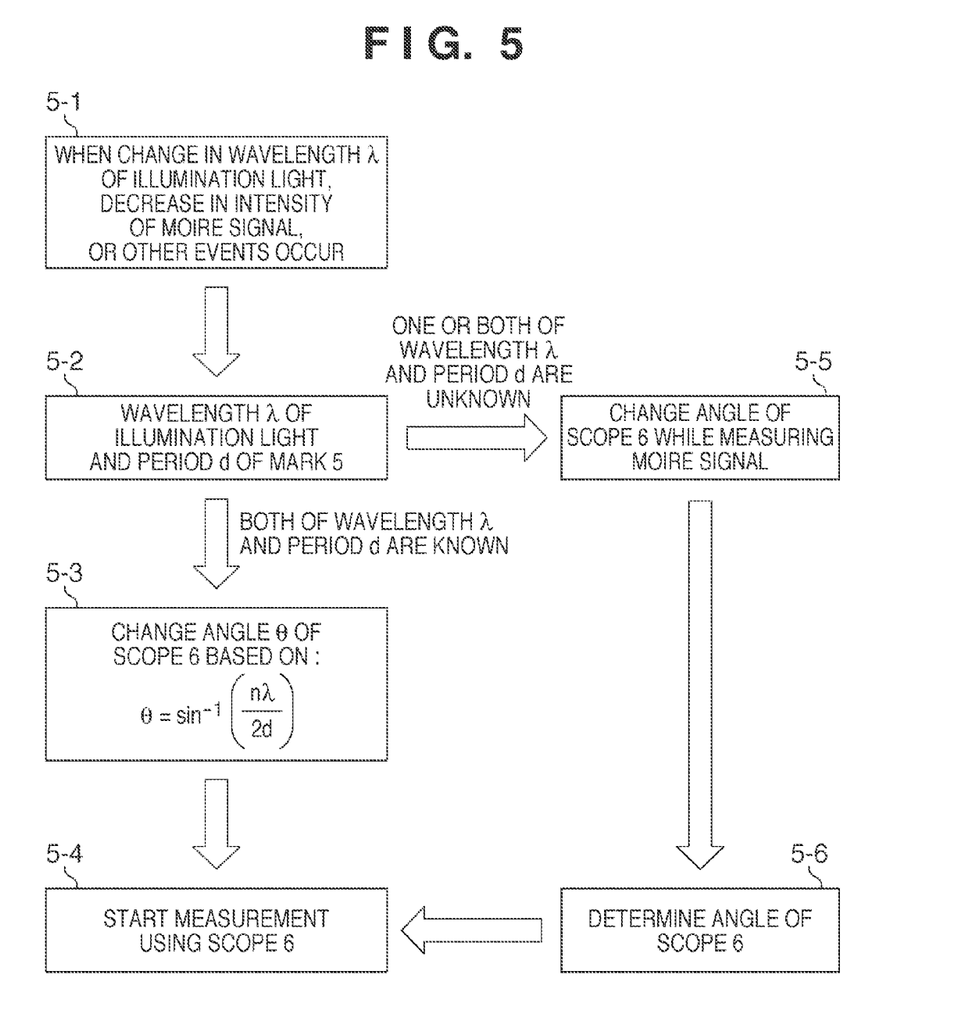
FIG. 5 is a flowchart showing a detection method in the first embodiment.

FIG. 5 shows a measurement method. The tilt angle θ of the scope 6 is changed when, for example, the wavelength θ of illumination light of the scope 6 has been changed, or the intensity of a moire signal has lowered (5-1). Note that illumination light may be produced by extracting a desired wavelength range by, for example, a bandpass filter using a light source having wavelengths in a wide range, such as a halogen lamp, or by switching monochromatic light sources such as LEDs from one to the other. When the wavelength λ of illumination light and the grating pitch d of the mark 5 in the x direction are known, the tilt angle θ of the scope 6 is automatically calculated by equation (2) mentioned above, so a tilt angle is set based on the calculation result (5-3). The grating period d of the mark 4 can be input into the adjusting device 12 as mark information in advance. The scope 6 set to have an optimum tilt angel measures the relative position between the mark 4 on the mold 2 and the mark 5 on the substrate 1 (5-4).

If at least one of the wavelength λ of illumination light and the grating pitch d of the mark 5 is unknown, the tilt angle θ of the scope 6 cannot be calculated using equation (2). In this case, the tilt angle θ is changed while observing moire fringes generated by the marks 4 and 5 (5-5), and the tilt angle beyond which the visibility of the moire fringes falls outside a tolerance is determined (5-6). Examples of indices of visibility used to determine the tilt angle are the amplitude, intensity, range, and contrast of a signal of moire fringes. The scope 6 set to have an optimum tilt angle in the foregoing way measures the relative position between the mark 4 on the mold 2 and the mark 5 on the substrate 1 (5-4).

Figure 6:
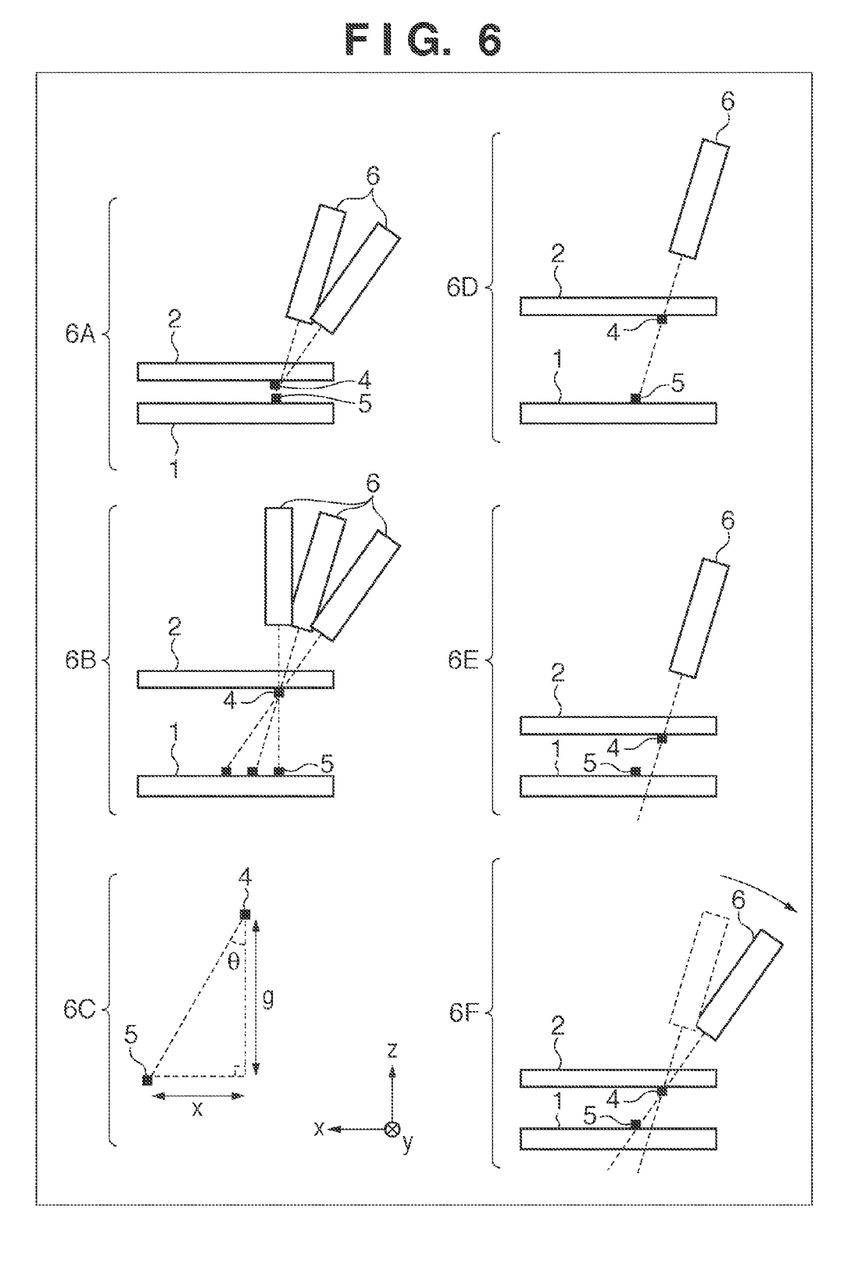
FIG. 6 shows views of the relationship between the interval between a mold and a substrate and the tilt angle of the detector.

If the interval between the marks 4 and 5 in the z direction is relatively narrow, as shown in part 6A of FIG. 6, the scope 6 can measure the two marks 4 and 5 at nearly the same position even after the tilt angle θ of the scope 6 is changed. In contrast, if the interval between the marks 4 and 5 is relatively wide, the scope 6 cannot measure the two marks 4 and 5 unless they are aligned on the optical axis of the scope 6 (part 6B in FIG. 6). To simultaneously detect the marks 4 and 5 by the scope 6 even in that case, the substrate stage must be shifted by x given by:

$$x = g \times \tan \theta \quad (3)$$

where g is the interval between the marks 4 and 5 in the z direction, and θ is the tilt angle of the scope 6 (part 6C in FIG. 6).

Also, as the interval between the two marks 4 and 5 in the z direction changes, the relative position between the marks 4 and 5 in the non-measurement direction (x direction) in the field of view of the scope 6 also changes because the optical axis of the scope 6 is tilted about the axis (y-axis) in the measurement direction. Therefore, conventionally, relatively large marks are used as the marks 4 and 5 so that they are superposed on each other even if their relative position changes. For example, when the interval between the mold 2 and the substrate 1 in the z direction is narrowed from that shown in part 6D of FIG. 6, the mark 5 appears to be shifted in the non-measurement direction (x direction) when viewed from the scope 6, as shown in part 6E of FIG. 6. By changing the tilt angle θ of the scope 6 in accordance with the interval between the marks 4 and 5 in the z direction, these marks can be simultaneously measured. At this time, equation (2) is not satisfied if only the tilt angle θ of the scope 6 is changed. However, optimum measurement conditions can be determined by changing the wavelength λ so as to satisfy equation (2) in accordance with the change in tilt angle θ of the scope 6. This makes it possible to satisfactorily perform measurement even when the interval between the mold 2 and the substrate 1 in the z direction is changed, without increasing the sizes of the marks 4 and 5. By setting the tilt angle θ of the scope 6 variable, a given degree of design freedom can be imparted to the marks. Conventionally, because the tilt angle θ of the scope 6 is fixed, the grating pitch d of the mark 5 cannot be considerably changed. However, when the user desires a small mark with a narrower grating pitch d, a considerable change in grating pitch d of the mark 5 can be achieved by changing the tilt angle θ of the scope 6.

Figure 7:
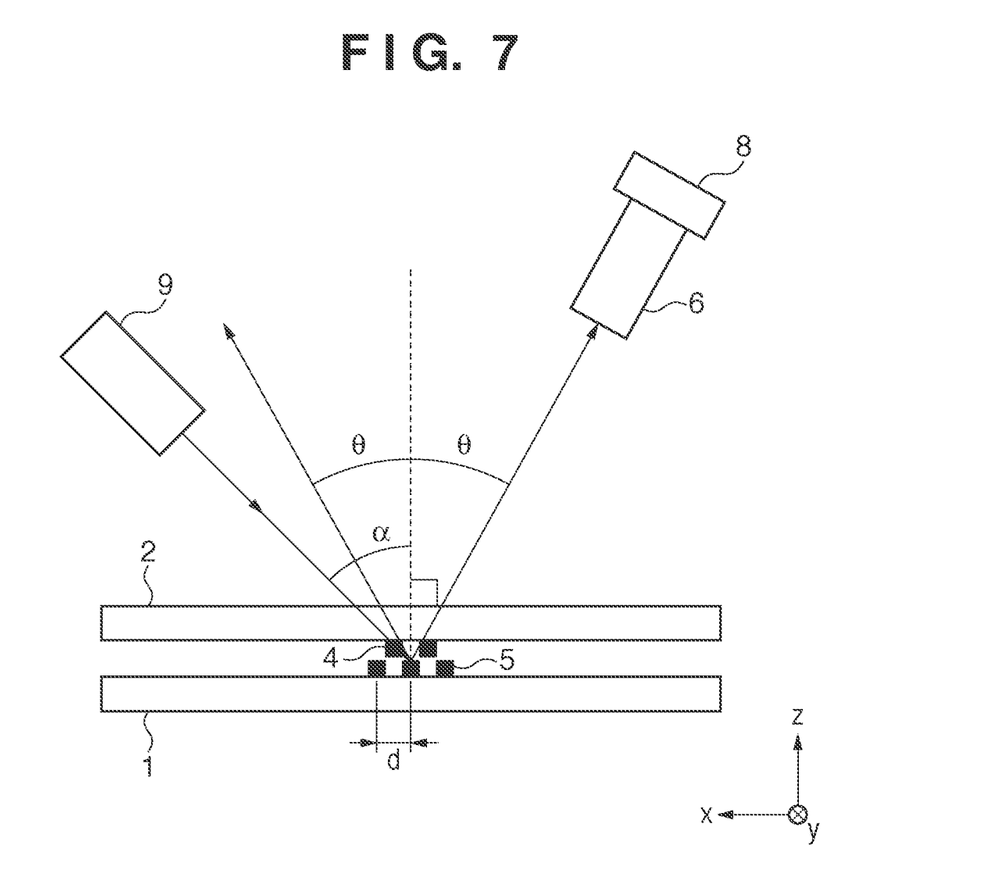
FIG. 7 is a view illustrating another example of the detector according to the first embodiment.

In the foregoing description, a single scope includes both an imaging optical system and an illumination system which illuminates the marks 4 and 5. However, an imaging optical system and an illumination system can also be separately built into different scopes. FIG. 7 shows another example of the first embodiment, in which an illumination system is separated from the scope 6. In this example, illumination light emitted by an illumination system 9 illuminates the mark 5 on the substrate 1, and light diffracted by the mark 5 is incident on the scope 6 to form an image on the image sensor 8. Even at this time, equation (1) holds. For example, if the tilt angle (the incident angle of illumination light) α of the illumination system 9, the wavelength λ of illumination light, and the grating pitch d of the mark 5 are determined, the tilt angle θ of the scope 6 is automatically determined as given by:

$$\theta = \pm \sin^{-1}\{(n\lambda/d) - \sin \alpha\} \quad (4)$$

The converse also holds, so if the tilt angle θ of the scope 6, the wavelength λ of illumination light, and the grating pitch d of the mark 5 are determined, the tilt angle α of the illumination system 9 is automatically determined. If three out of the tilt angle α of the illumination system 9, the tilt angle θ of the scope 6, the wavelength λ of illumination light, and the grating pitch d of the mark 5 are determined, the remaining one is automatically determined, as described above. If more than one unknown numerical value exists, optimum measurement conditions can be searched for by changing variable items: the tilt angle α of the illumination system 9, the tilt angle θ of the scope 6, and the wavelength λ of illumination light.

Figure 8:
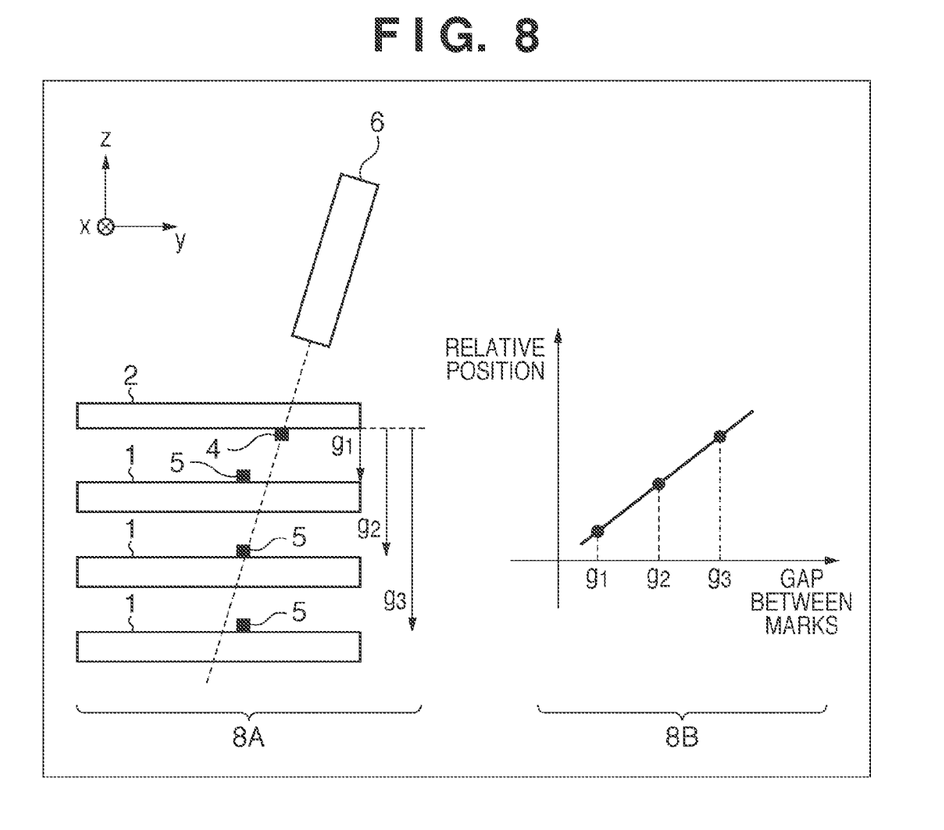
FIG. 8 shows views of the relationship between the gap between the mold and the substrate and the detection result.

Upon changing the tilt angle θ of the scope 6, an unexpected tilt may occur within a plane (y-z plane) including both the y-axis and the optical axis of the scope 6 due, for example, to an installation error or driving error of the driving mechanism in the adjusting device 12. Therefore, upon measuring the relative position (amount of shift) between the mold 2 and the substrate 1 (two marks 4 and 5) in the measurement direction (y direction) by the scope 6, an error which depends on the interval (gap) between the mold 2 and the substrate 1 (two marks 4 and 5) in the z direction may occur in the measured value. Part 8A in FIG. 8 is a schematic view showing the fact that the measured value of the relative position between the marks 4 and 5 in the y direction depends on the gap in the z direction. Note that if the telecentricity deteriorates due to the unexpected tilt, the measured value changes depending on the gap between the marks 4 and 5. Part 8A in FIG. 8 shows a change in gap between the marks 4 and 5 from g1 to g3. The relative position between the marks 4 and 5, which is measured by the scope 6 at this time, changes depending on the gap between the marks 4 and 5, as shown in part 8B of FIG. 8. Hence, the gap between the marks 4 and 5 is changed within the depth of focus periodically (for example, for every change in tilt angle or before measurement) to measure the amounts of shift of the mark 5 corresponding to a plurality of amounts of gap, thereby obtaining the relationship between the gap between the marks 4 and 5 and the amount of change in measured relative position. The interval between the mold 2 and the substrate 1 in the z direction is measured by, for example, an interferometer (not shown). Thus, as long as the relationship between the gap between the marks 4 and 5 and the amount of change in relative position is known, the amount of change in relative position, which occurs due to the tilt of the scope 6, can be estimated from the amount of gap, and the measurement result can be corrected by taking it into consideration as an offset. In the foregoing way, the scope 6 can measure the relative position between the marks 4 and 5 in a good state (with good visibility).

Second Embodiment

Figure 9:
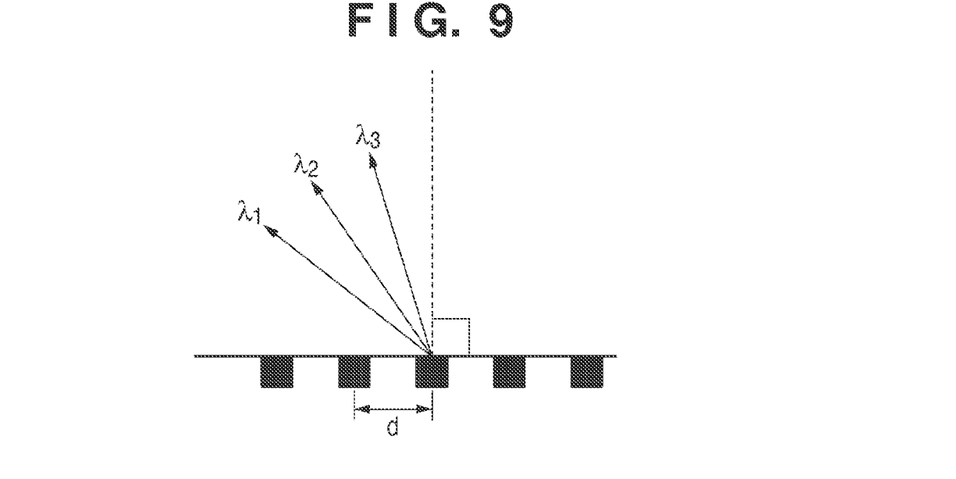
FIG. 9 is a view showing diffracted light in the second embodiment.

A detector according to the second embodiment will be described with reference to FIG. 9. Upon irradiation with broadband light with intensities in a wide wavelength range, a mark 5 on a substrate exhibits the performance of a diffraction grating, so different wavelengths are diffracted by different angles. FIG. 9 shows this mechanism, in which the diffraction angle is based on equation (1), (2), or (4). The wavelength λ of diffracted light is λ1<λ2<λ3. Hence, when broadband light is used as illumination light, a mark portion is irradiated with the illumination light, and the tilt angle θ is changed while measuring a moire signal from a mark 4 and the mark 5, thereby searching for a wavelength and a tilt angle which are optimum for measurement. Examples of indices of the optimum tilt angle are the intensity and contrast of the moire signal. A measurement method in this embodiment is the same as in the first embodiment.

Third Embodiment

Figure 10:
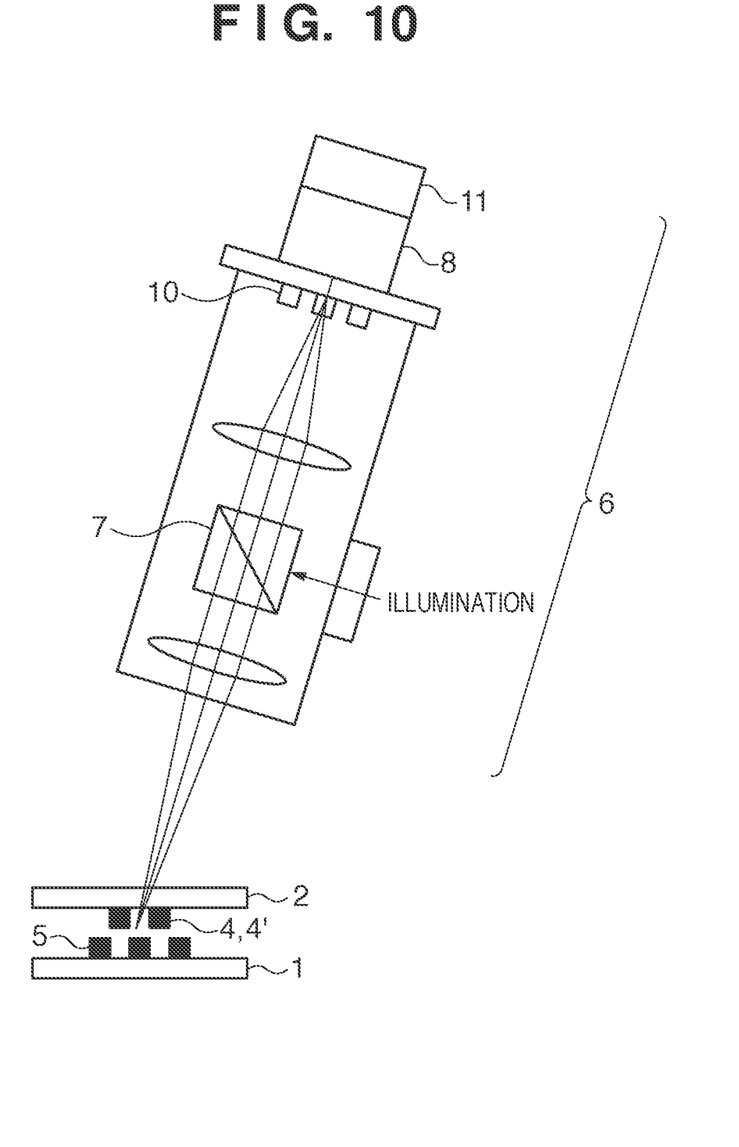
FIG. 10 is a view showing a detector according to the third embodiment.

A detector according to the third embodiment will be described next with reference to FIG. 10. FIG. 10 shows a scope 6 for measuring only a mark 4 on a mold 2. As the scope 6, the same scope as in the first embodiment may be used or a dedicated scope may be separately provided. Because a force acts on the mold 2 upon pressing and releasing the mold 2 in an imprint process, the mold 2 may shift with respect to an imprint head 3. In this case, the position of the mold 2 must be measured in real time. The mark 4 used for alignment with a mark 5 on a substrate 1, and a mark 4' used to measure the position of the mold 2 are formed on the mold 2 shown in FIG. 10. The marks 4 and 4' are designed to have different optimum diffraction angles in measurement by changing the pitch.

As a measurement method, the mark 4' may be directly measured in the form of an image or signal intensity. Also, a reference mark 10 shown in FIG. 10 may be placed at a position optically conjugate to the mark 4' inside the scope 6 to form an image of the mark 4' on the reference mark 10, thereby measuring the mark 4' in the form of a moire signal generated due to factors associated with their relative position. At this time, the mark 5 is present on the substrate 1, so a moire signal is generated due to factors associated with the relative position between the marks 4' and 5. This presents an obstacle in measuring only the mark 4'. To prevent this, the tilt angle of the scope 6 is set variable to set the scope 6 to have a tilt angle at which no moire signal with the mark 5 is generated, thereby measuring only the mark 4'. To do this, the tilt angle of the scope 6 or the wavelength of illumination light, which does not correspond to equations (1) to (4), need only be determined. Alternatively, the tilt angle or the wavelength of illumination light may be changed in the scope 6 or a separate dedicated scope, thereby searching for the position at which a moire signal generated by the marks 4' and 5 minimizes. In the foregoing way, the position of only the mark on the mold 2 can be measured.

Method of Manufacturing Article

A method of manufacturing a device (for example, a semiconductor integrated circuit device or a liquid crystal display device) as an article includes a step of transferring (forming)

a pattern onto a substrate (a wafer, a glass plate, or a film-like substrate) using the above-mentioned imprint apparatus. This method can also include a step of etching the substrate onto which the pattern is transferred. Note that when other articles such as a patterned medium (recording medium) or an optical element are to be manufactured, this method can include other processing steps of processing the substrate onto which the pattern is transferred, in place of the etching step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-112664, filed May 14, 2010, which is hereby incorporated by reference herein in its entirety.

What is claimed is:

1. An imprint apparatus which molds an imprint material on a substrate with a mold to form a pattern on the substrate, the apparatus comprising:
   a holder configured to hold a mold on which a first mark is formed;
   a stage configured to hold a substrate on which a second mark is formed;
   a detector; and
   an adjusting device configured to adjust an angle of an optical axis of the detector,
   wherein the second mark includes a grating pattern having grating pitches in both a first direction and a second direction that are respectively parallel to a first axis and a second axis that are parallel to a pattern surface of the mold and orthogonal to each other,
   wherein the first mark includes a grating pattern having a grating pitch in the first direction,
   wherein the first mark and the second mark have respective grating pitches different from each other in the first direction,
   wherein the detector includes an image sensor, and an optical system configured to form a moire fringe on an image sensing surface of the image sensor using a light that is obliquely incident on the first mark, transmitted through a grating of the first mark, diffracted by a grating of the second mark, and transmitted again through the grating of the first mark, and
   wherein the adjusting device is configured to change an angle between the optical axis of the detector and a third axis that is perpendicular to the first axis and the second axis.

2. The apparatus according to claim 1, wherein the adjusting device is configured to adjust the angle of the optical axis of the detector so that a visibility of the moire fringe formed on the image sensing surface falls within a tolerance.

3. The apparatus according to claim 1, wherein the adjusting device is configured to adjust the angle between the optical axis of the detector and the third axis so as to satisfy:

$$\theta = \pm\sin^{-1}\{(n\lambda/d) - \sin\alpha\},$$

where $\alpha$ is an angle at which a light that is obliquely incident on the first mark is incident on the second mark, d is the grating pitch of the second mark in the second direction, n is a natural number, and $\theta$ is the angle between the optical axis of the detector and the third axis.

4. The apparatus according to claim 1, wherein:
   the detector includes an illumination system configured to emit a light so that the emitted light is obliquely incident on the first mark,
   the detector is configured so that the optical axis of the detector and an optical axis of the illumination system coincide with each other,
   the adjusting device is configured to adjust the angle between the optical axis of the detector and the third axis so as to satisfy:

$$\theta = \sin^{-1}(n\lambda/2d),$$

where d is the grating pitch of the second mark in the second direction, n is a natural number, and $\theta$ is the angle between the optical axis of the detector and the third axis.

5. The apparatus according to claim 2, wherein an index indicating the visibility of the moire fringe includes one of an amplitude, an intensity, a range, or a contrast of a signal of the moire fringe.

6. The apparatus according to claim 1, wherein:
   the detector includes a processor configured to obtain a relative position between the first mark and the second mark in the first direction based on information of the moire fringe formed on the image sensing surface, and
   the apparatus is configured to adjust a relative position between the mold and the substrate in the first direction in accordance with the relative position obtained by the processor.

7. The apparatus according to claim 6, wherein the processor is configured to obtain the relative position between the first mark and the second mark in the first direction further based on information indicating an interval between the first mark and the second mark in a direction parallel to the third axis.

8. A method of manufacturing an article, the method comprising:
   forming a pattern on a substrate using an imprint apparatus; and
   processing the substrate, on which the pattern has been formed, to manufacture the article,
   wherein the imprint apparatus includes:
   a holder configured to hold a mold on which a first mark is formed;
   a stage configured to hold a substrate on which a second mark is formed;
   a detector; and
   an adjusting device configured to adjust an angle of an optical axis of the detector,
   wherein the second mark includes a grating pattern having grating pitches in both a first direction and a second direction that are respectively parallel to a first axis and a second axis that are parallel to a pattern surface of the mold and orthogonal to each other,
   wherein the first mark includes a grating pattern having a grating pitch in the first direction,
   wherein the first mark and the second mark have respective grating pitches different from each other in the first direction, and
   wherein the detector includes an image sensor, and an optical system configured to form a moire fringe on an image sensing surface of the image sensor using a light that is obliquely incident on the first mark, transmitted through a grating of the first mark, diffracted by a grating of the second mark, and transmitted again through the grating of the first mark, wherein the adjusting device is configured to change an angle between the optical axis of the detector and a third axis that is perpendicular to the first axis and the second axis.

9. The apparatus according to claim 1, wherein the adjusting device is configured to change, in a plane including the second axis and the third axis, an angle of the optical axis of the detector from the third axis.

10. The apparatus according to claim 1, wherein the adjusting device is configured to change an angle of the optical axis of the detector in accordance with a wavelength of a light that is obliquely incident on the first mark.

11. An imprint apparatus for aligning a mold with a substrate using a first mark and a second mark and molding an imprint material on the substrate with the mold to form a pattern on the substrate, the apparatus comprising:
   a stage configured to hold the substrate;
   a detector configured to obliquely illuminate the first mark and the second mark and to detect a diffracted light from the first mark and the second mark; and
   an adjusting device configured to adjust an angle of an optical axis of the detector,
   wherein the second mark includes a grating pattern having grating pitches in both a first direction and a second direction that are respectively parallel to a first axis and a second axis that are parallel to a pattern surface of the mold and orthogonal to each other,
   wherein the first mark includes a grating pattern having a grating pitch in the first direction,
   wherein the first mark and the second mark have respective grating pitches different from each other in the first direction,
   wherein the detector includes an image sensor, and an optical system configured to form a moire fringe on an image sensing surface of the image sensor using a light that is diffracted by a grating of the first mark and a grating of the second mark, and
   wherein the adjusting device is configured to change an angle of the optical axis of the detector from a third axis that is perpendicular to the first axis and the second axis.

12. A position detection apparatus which detects a relative position of two objects using a first mark and a second mark, the apparatus comprising:
   a detector configured to obliquely illuminate the first mark and the second mark and to detect a diffracted light from the first mark and the second mark: and
   an adjusting device configured to adjust an angle of an optical axis of the detector,
   wherein the second mark includes a grating pattern having grating pitches in both a first direction and a second direction that are respectively parallel to a first axis and a second axis that are parallel to a pattern surface of the mold and orthogonal to each other,
   wherein the first mark includes a grating pattern having a grating pitch in the first direction,
   wherein the first mark and the second mark have respective grating pitches different from each other in the first direction, wherein the detector includes an image sensor, and an optical system configured to form a moire fringe on an image sensing surface of the image sensor using a light that is diffracted by a grating of the first mark and a grating of the second mark, and
   wherein the adjusting device is configured to change an angle of the optical axis of the detector from a third axis that is perpendicular to the first axis and the second axis.

13. The apparatus according to claim 12, wherein the adjusting device is configured to adjust the angle of the optical axis of the detector so that a visibility of the moire fringe formed on the image sensing surface falls within a tolerance.

14. An alignment apparatus which aligns a object using a first mark and a second mark, the apparatus comprising:
   a stage configured to hold the object, a detector configured to obliquely illuminate the first mark and the second mark and to detect a diffracted light from the first mark and the second mark; and
   an adjusting device configured to adjust an angle of an optical axis of the detector, wherein the second mark includes a grating pattern having grating pitches in both a first direction and a second direction that are respectively parallel to a first axis and a second axis that are parallel to a pattern surface of the mold and orthogonal to each other, wherein the first mark includes a grating pattern having a grating pitch in the first direction, wherein the first mark and the second mark have respective grating pitches different from each other in the first direction,
   wherein the detector includes an image sensor, and an optical system configured to form a moire fringe on an image sensing surface of the image sensor using a light that is diffracted by a grating of the first mark and a grating of the second mark, and wherein the adjusting device is configured to change an angle of the optical axis of the detector from a third axis that is perpendicular to the first axis and the second axis.

* * * * *